United States Patent [19]

Hashimoto

[11] Patent Number: 5,700,720

[45] Date of Patent: Dec. 23, 1997

[54] METHOD OF MANUFACTURING SEMICONDUCTOR DEVICE HAVING MULTILAYER INTERCONNECTION

[75] Inventor: Hidetsuna Hashimoto, Kawasaki, Japan

[73] Assignee: Kabushiki Kaisha Toshiba, Kawasaki, Japan

[21] Appl. No.: 575,211

[22] Filed: Dec. 20, 1995

[30] Foreign Application Priority Data

Dec. 26, 1994 [JP] Japan .................. 6-322949

[51] Int. Cl.$^6$ .................................. H01L 21/44
[52] U.S. Cl. .................. 437/195; 437/228; 437/231; 427/255.3; 427/255.7
[58] Field of Search ................. 437/195, 228, 437/235, 236, 231; 427/255.3, 255.7

[56] References Cited

U.S. PATENT DOCUMENTS 5,314,724  5/1994  Tsukune et al. .................. 427/489
5,387,546  2/1995  Maeda et al. .................... 437/174

OTHER PUBLICATIONS

Dobson et al, Semicond. Int. pp. 85–88 (1994).
Matsuura et al IEDM vol. 94 pp. 117–120 (IEEE 1994).
Dobson et al., "Advanced SiO$_2$ Planarization Using Silane and H$_2$O$_2$", Semiconductor International, pp. 85–88, (1994).
Matsuura et al., "Novel Self-planarizing CVD Oxide for Interlayer Dielectric Applications", IEEE, pp. 5.7.1–5.7.4, (1994).

*Primary Examiner*—David Graybill
*Assistant Examiner*—C. Everhart
*Attorney, Agent, or Firm*—Finnegan, Henderson, Farabow, Garrett & Dunner, L.L.P.

[57] ABSTRACT

According to the method of manufacturing a semiconductor device having a multilayer interconnection structure, lower wires are formed on a semiconductor substrate. Then, a first reflow SiO$_2$ film having a reflow form is formed on the semiconductor substrate and the lower wires by reacting SiH$_4$ gas with H$_2$O$_2$ in a vacuum at 650 Pa or less within a range from −10 to 10°C. After the first reflow SiO$_2$ film is formed, heat treatment is performed at a predetermined high temperature on the semiconductor substrate on which the first reflow SiO$_2$ film, and a second reflow SiO$_2$ film having a reflow form is formed on the semiconductor substrate and the lower wires by reacting SiH$_4$ gas with H$_2$O$_2$ in a vacuum at 650 Pa or less within a range from −10 to 10°C. The heat treatment step performed after the first reflow SiO$_2$ film forming step and the second reflow SiO$_2$ film forming step subsequent thereto are respectively performed at least once. After the abovementioned steps are finished, upper wires are formed on the second reflow SiO$_2$ film.

4 Claims, 2 Drawing Sheets

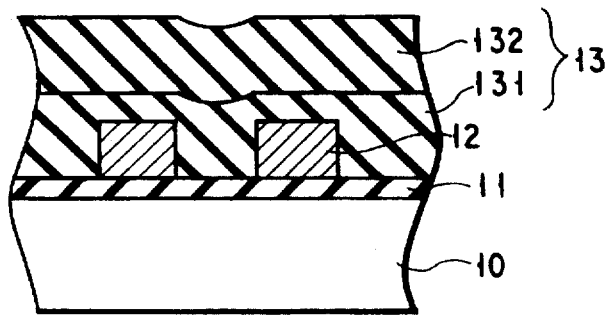
F I G. 2
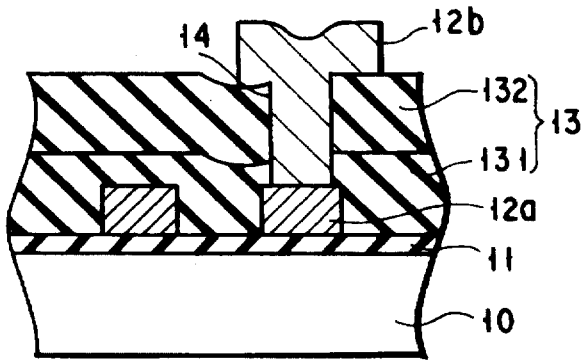
F I G. 4

METHOD OF MANUFACTURING SEMICONDUCTOR DEVICE HAVING MULTILAYER INTERCONNECTION

BACKGROUND OF THE INVENTION

1. Field of the Invention

The present invention relates to a method of manufacturing a semiconductor device having a multilayer interconnection, particularly to a method of manufacturing a semiconductor device by using a technique of forming a reflow insulating film.

2. Description of the Related Art

As the integration density of a semiconductor device increases, a multilayer interconnection technique for forming a plurality of wiring layers on a substrate is more frequently used. However, the manufacturing of the semiconductor device having the multilayer interconnection is complicated, requiring more manufacturing process also increases.

The steps of forming wiring layers greatly influences the manufacturing cost of the semiconductor device. To reduce the cost, it has been increasingly demanded that the number of the steps of forming wiring layers be decreased.

The conventional process of forming multilayer interconnection will be described below.

The first wiring material is deposited on an insulating layer provided on a semiconductor substrate and subjected to patterning, forming lower wires. A first insulating film is formed on the lower wires and the insulating film, fills the spaces between the lower wires.

Due to the lower wiring pattern and the like, steps are made on the surface of the first insulating film. The steps may adversely affect the deposition of a second wiring material and the patterning of this material into upper wires, which results in serious defects such as breakage of wiring and occurrence of a short circuit.

Conventionally, to prevent this problem, the surface of the first insulating layer is planarized by resist etchback to decrease the height of the steps before the second wiring material is deposited on the first insulating film.

This conventional process of forming interlayer insulating films, however, comprises many steps, i.e., first deposition for a first insulating film, planarization of the first insulating film, and second deposition for a second insulating film. The many steps required in the process has been an obstacle to the desired decrease in the number of the steps required in providing multilayer interconnection.

In addition to the above-mentioned technique for planarizing the surface of the first insulating film, the method using a spin-on-glass (SOG) film is also well-known. This method is derived to decrease the height of steps under the upper wiring layer by forming a SOG film as an insulating material on the first insulating film.

In this method, however, a heat treatment needs to be performed a plurality of times to form (bake) the SOG film. Further, unnecessary portions of the SOG film needs to be removed by resist etchback in order to form a reliable upper wiring layer. Therefore, the method using a SOG film also comprises many steps, and cannot fully reduce the number of steps required for producing multilayer interconnection.

One more method for reducing the number of steps for forming multilayer interconnection attracts attention. This method is to react $SiH_4$ gas with $H_2O_2$ (hydrogen peroxide) used as an oxidant, in a vacuum chamber at a low temperature such as 0° C., thereby to form a reflow insulating film on the lower wiring layer.

In this method, the filling of insulating material in the spaces between the lower wires and the planarization of the surface of the insulating film can be carried out simultaneously. As mentioned before, many steps has been required to form the interlayer insulating film with the conventional method. According to this method, however, manufacturing steps up to the planarization step can be simultaneously performed with one deposition. The number of the processes for the multilayer interconnection can be thus reduced.

However, in this method of forming a reflow $SiO_2$ film, $SiH_4$ reacts with $H_2O_2$, forming $SiO_2$ and also water. The reflow $SiO_2$ film inevitably contains much water. The water in the insulating film will be rapidly discharged during the deposition or during the heat treatment (at 450° C. for 30 minutes) necessarily performed thereafter. The insulating film is thereby cracked.

FIG. 1 is a graph representing the conditions in which cracks are made in a reflow $SiO_2$ film by the above-mentioned method.

This graph has been prepared by using as a parameter the thickness of the reflow $SiO_2$ film and that of a $SiO_2$ film (hereinafter referred to as "cap film") formed by the conventional plasma CVD (chemical vapor development) on the reflow $SiO_2$ film, and shows whether or not cracks were made when the heat treatment was performed for 30 minutes at 450° C. after the deposition.

As shown in FIG. 1, the crack were made in the case where no cap film existed, and the case where the thickness of the reflow $SiO_2$ film was 1.1 μm or more and the cap film existed. Thus, the reflow $SiO_2$ film must be less thick than 1.1 μm in view of the crack resistance. In this graph, this upper limit of the film thickness to avoid the generation of the crack is as low as 1.0 μm.

While, the reflow $SiO_2$ film also needs to be formed with a predetermined thickness sufficient to planarize the surface of the lower wiring layer, though the crack resistance have to be improved.

As described above, the conventional reflow $SiO_2$ film needs to have a predetermined thickness sufficient to planarize the surface of the lower wiring layer, but not exceeding an upper limit in view of the crack resistance.

SUMMARY OF THE INVENTION

The present invention is developed to solve the above-mentioned problem, and intends to provide a method for manufacturing a semiconductor device having a multilayer interconnection structure wherein the crack resistance of a reflow $SiO_2$ film obtained when a reflow insulating film forming technique is employed to form an interlayer insulating film in a multilayer interconnection forming process can be improved and a $SiO_2$ film thickness sufficient to planarize the reflow $SiO_2$ film can be secured.

In order to attain the above object, the method of manufacturing a semiconductor device having a multilayer interconnection structure comprises a step of forming lower wires on a semiconductor substrate; a step of forming a first reflow $SiO_2$ film having a reflow form on the semiconductor substrate and the lower wires by reacting $SiH_4$ gas with $H_2O_2$ in a vacuum at 650 Pa or less within a range from −10° to 10° C.; a step of performing a heat treatment at a predetermined high temperature on the semiconductor substrate on which the first reflow $SiO_2$ film; and a step of forming a second reflow $SiO_2$ film having a reflow form on the semiconductor substrate and the lower wires by reacting SiH$_4$ gas with H$_2$O$_2$ in a vacuum at 650 Pa or less within a range from −10° to 10° C., the heat treatment step performed after the first reflow SiO$_2$ film forming step and the second reflow SiO$_2$ film forming step subsequent thereto are performed respectively at least once.

According to the above-mentioned manufacturing method of a semiconductor device having a multilayer interconnection structure, the crack resistance of a reflow SiO$_2$ film obtained when a reflow insulating film forming technique is employed to form an interlayer insulating film in a multilayer interconnection forming process can be improved and a SiO$_2$ film thickness sufficient to planarize the reflow SiO$_2$ film can be secured, with a result that upper wires to be formed thereon can be formed more finely.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a sectional view of a part of a semiconductor device formed in accordance with a reflow insulating film forming technique employed, to form an interlayer insulating film in a multilayer interconnection forming process;

FIG. 4 is a sectional view of a part of the multilayer interconnection structure illustrating a step of forming upper wires.

DETAILED DESCRIPTION OF THE PREFERRED EMBODIMENTS

One preferred embodiment of the present invention will be described below with reference to the drawings.

FIG. 2 is a sectional view of a part of a semiconductor device formed in accordance with a reflow insulating film forming technique employed to form an interlayer insulating film in a multilayer interconnection forming process.

A first wiring material (alminium, for example) for lower wires is deposited on an insulating film 11 on a semiconductor substrate (generally formed of a silicon wafer) 10 by use of a technique such as sputtering. Then, the patterning of the first wiring material is performed to form lower wires 12 by use of photolithography and reactive ion etching (RIE).

Succeedingly, interlayer insulating films are formed by engraving insulating films in the spaces between the parallelly arranged lower wires 12 and depositing an insulating film on the lower wires 12.

Figure 1:
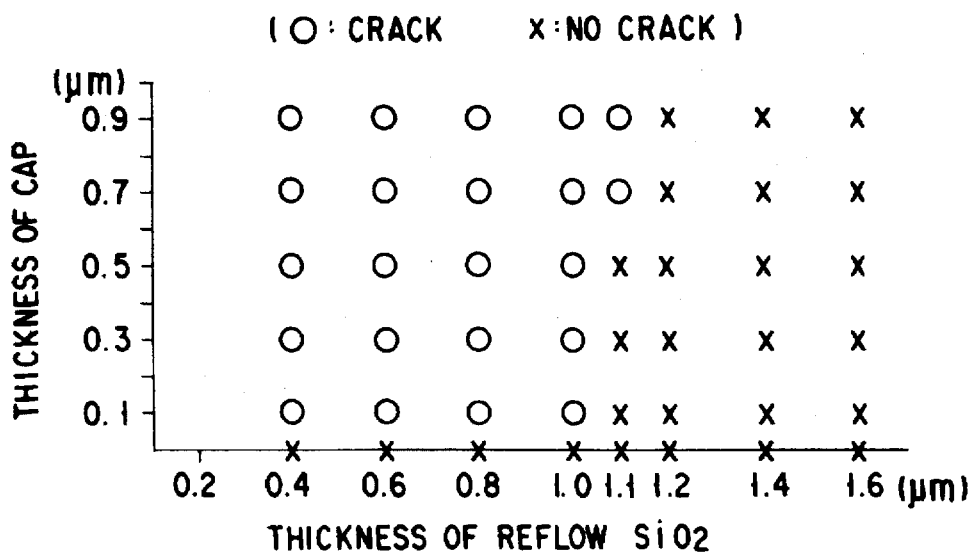
FIG. 1 shows the result of the measurement of the generation of the cracks during the heat treatment on the reflow SiO$_2$ film by defining as a parameter the thicknesses of a reflow SiO$_2$ film and a cap film formed on the reflow SiO$_2$ film which is formed in accordance with a reflow insulating film forming technique employed to form an interlayer insulating film in a multilayer interconnection forming process.
Figure 3:
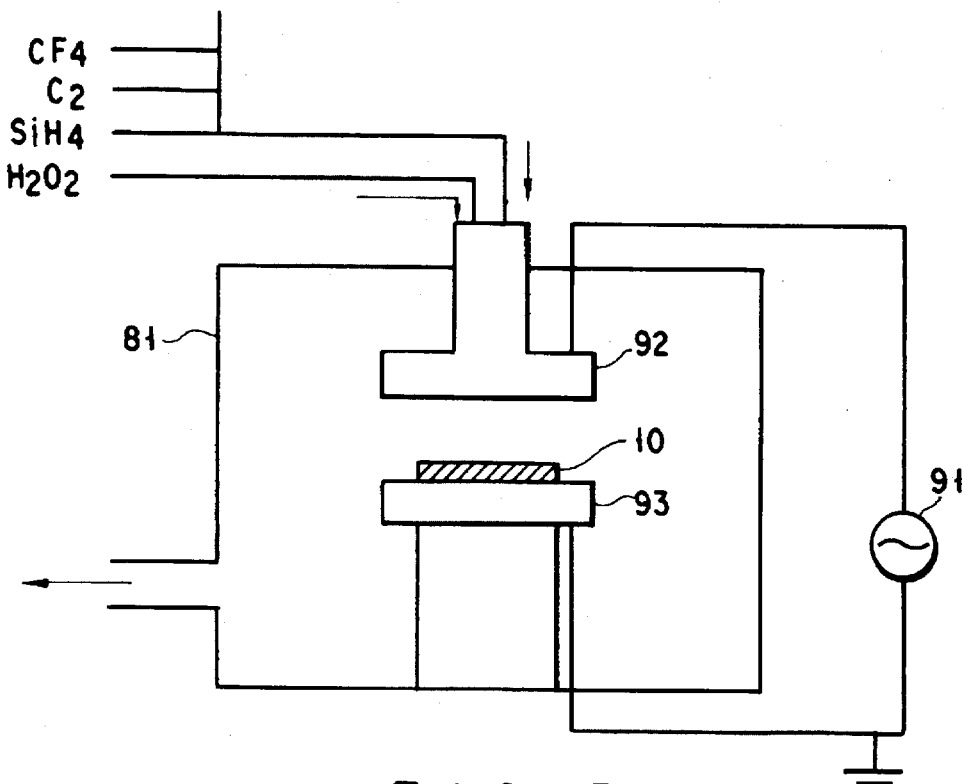
FIG. 3 is a schematic view illustrating a reaction chamber in which the reflow SiO$_2$ film is formed.

This interlayer insulating films 131 are formed as shown in FIG. 3. In a reaction chamber 81 of a low-pressure CVD apparatus, the semiconductor substrate 10 on which the lower wires 12 are formed is located on a lower electrode 93. SiH$_4$ gas and H$_2$O$_2$ are introduced into the reaction chamber 81 to be reacted with each other in a vacuum at 650 Pa or less within a range from −10° to 10° C. (0° C., for example). By reacting the SiH$_4$ gas with H$_2$O$_2$ in such a manner, a first silicon oxide film (a first reflow SiO$_2$ film) 131 as an interlayer insulating film is obtained as shown in FIG. 2.

Subsequently, a heat treatment is performed on the semiconductor substrate 10 at a predetermined high temperature (350° C.) within a range of 100°–500° C. in an atmosphere of an inert gas such as N$_2$ for 5 minutes, for example. Then, SiH$_4$ gas and H$_2$O$_2$ are introduced into the reaction chamber again to be reacted with each other in a vacuum at 650 Pa or less within a range from −10° to 10° C. (0° C., for example) and to form a second reflow SiO$_2$ film 132 on the semiconductor substrate 10 on which the heat treatment has been performed.

In this embodiment, the heat treatment step and the second reflow SiO$_2$ film forming step are performed respectively at least once after the first reflow SiO$_2$ film forming step, but may be repeated a plurality of times in case of necessity.

In the above embodiment, the heat treatment step and the second reflow SiO$_2$ film forming step subsequent thereto are performed once, and the reflow SiO$_2$ film is deposited such that a half of the predetermined thickness of the reflow SiO$_2$ film is deposited in the first reflow SiO$_2$ film forming step, and then another half is deposited in the second reflow SiO$_2$ film forming step.

Next, as shown in FIG. 4, an opening 14 for contact hole or via hole is formed directly on the reflow SiO$_2$ film 13 or on an interlayer insulating film (not shown) deposited on the reflow SiO$_2$ film 13. Then, an upper wires 12b are formed by depositing the second wiring material for upper wires and by transferring the pattern thereon.

In the above embodiment, the reflow insulating film forming technique is employed to form the reflow SiO$_2$ film 13 as an interlayer insulating film in the multilayer interconnection. According to this technique, the first reflow SiO$_2$ film forming step of the first reflow SiO$_2$ film 131 is firstly performed, and the heat treatment and the second reflow SiO$_2$ film forming step of the second reflow SiO$_2$ film 132 following thereto are performed at least once.

In this first reflow SiO$_2$ film forming step, the deposited film inevitably comes to contain the water. The water contained in the deposited film is, however, evaporated in the heat treatment step performed thereafter.

Accordingly, though water may be created in the second reflow SiO$_2$ film forming step of the second reflow SiO$_2$ film 132 and the deposited film may contain the water, the total amount of the water contained in the reflow SiO$_2$ film is small in comparing the conventional reflow SiO$_2$ film because the first SiO$_2$ film does not contain the water. As a result, the crack generation during the necessary heat treatment performed thereafter may be suppressed and the crack resistance of the reflow insulating film can be improved.

Figure 5:
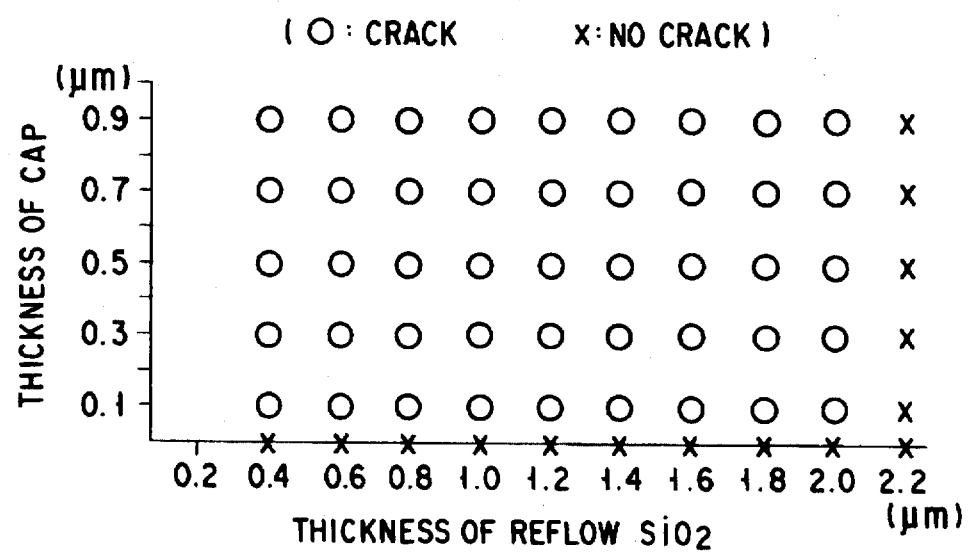
FIG. 5 shows the result of the measurement of the generation of the cracks during the heat treatment on the reflow SiO$_2$ film by defining as a parameter the thicknesses of a reflow SiO$_2$ film and a cap film formed on the reflow SiO$_2$ film which is formed in accordance with a process shown in FIG. 2.

FIG. 5 shows the result of the measurement of the generation of the cracks during the heat treatment performed for 30 minutes at 450° C. after the deposition on the reflow $SiO_2$ film 13 by defining as a parameter the thicknesses of the reflow $SiO_2$ film obtained in this manner and a cap film formed in accordance with the conventional plasma CVD method on the reflow $SiO_2$ film 13.

As shown in FIG. 5, when the cap film is not formed on the reflow insulating film, the crack generation of the reflow $SiO_2$ film 13 comprised of the first and second reflow $SiO_2$ films 131 and 132 obtained in the embodiment described above is the same as that of the conventional case. When the cap film is formed, however, the upper limit value of the film thickness of the reflow $SiO_2$ film 13 up to which the crack is not generated is increased to 2.0 μm. The upper limit value of the conventional insulating film is 1.0 μm, and the crack resistance is clearly improved.

As described above, according to the abovementioned manufacturing method, the crack resistance of the reflow $SiO_2$ film 13 can be improved and the film thickness sufficient to planarize the reflow $SiO_2$ film 13 can be secured, with a result that the planarity of the surface of the interlayer insulating film can be improved and the upper wires to be formed thereon can be formed more finely.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device having a multilayer interconnection structure comprising the steps of:

forming lower wires on a semiconductor substrate;

forming a first reflow $SiCO_2$ film having a reflow form on the semiconductor substrate and the lower wires by reacting $SiH_4$ gas with $H_2O_2$ in a vacuum at 650 Pa or less and at a temperature within a range from −10° to 10° C.;

performing a heat treatment at a high temperature on the semiconductor substrate and said first reflow $SiO_2$ film;

forming a second reflow $SiO_2$ film having a reflow form on the first reflow $SiO_2$ film by reacting $SiH_4$ gas with $H_2O_2$ in a vacuum at 650 Pa or less and at a temperature within a range from −10° to 10° C., said heat treatment step performed after the first reflow $SiO_2$ film forming step and the second reflow $SiO_2$ film forming step subsequent thereto being respectively performed at least once: and forming upper wires on the second reflow $SiO_2$ film.

2. A method according to claim 1, wherein the heat treatment is performed at a temperature within a range of 100°–500° C. in an atmosphere of an inert gas.

3. A method according to claim 1, wherein the heat treatment is performed at 350° C. for 5 minutes.

4. A method according to claim 1, wherein the heat treatment step performed after the first reflow $SiO_2$ film forming step and the second reflow $SiO_2$ film forming step subsequent thereto are respectively performed a plurality of times.

\* \* \* \* \*

UNITED STATES PATENT AND TRADEMARK OFFICE
CERTIFICATE OF CORRECTION

PATENT NO. : 5,700,720
DATED : December 23, 1997
INVENTOR(S) : Hidetsuna HASHIMOTO It is certified that error appears in the above-indentified patent and that said Letters Patent is hereby corrected as shown below:

Claim 1, column 6, line 6, "$SiCO_2$" should read --$SiO_2$--.

Claim 1, column 6, line 21, "once:" should read --once;--.

Signed and Sealed this

Twenty-third Day of June, 1998

Attest:

BRUCE LEHMAN

*Attesting Officer*　　*Commissioner of Patents and Trademarks*